United States Patent
Newton et al.

(10) Patent No.: US 10,270,366 B2
(45) Date of Patent: Apr. 23, 2019

(54) DEVICE AND METHOD FOR GENERATING A NEGATIVE VOLTAGE FOR A HIGH SIDE SWITCH IN AN INVERTER

(71) Applicant: Hanon Systems, Daejeon (KR)

(72) Inventors: Stephen J. Newton, Ann Arbor, MI (US); Stephan Werker, Merzenich (DE); Philipp Karutz, Köln (DE)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 15/831,821

(22) Filed: Dec. 5, 2017

(65) Prior Publication Data

US 2018/0159442 A1 Jun. 7, 2018

(30) Foreign Application Priority Data

Dec. 7, 2016 (DE) .................. 10 2016 123 678

(51) Int. Cl.

| | |
|---|---|
| *H02M 7/538* | (2007.01) |
| *H02M 7/5387* | (2007.01) |
| *H02M 1/084* | (2006.01) |
| *H02M 1/32* | (2007.01) |
| *H02M 3/158* | (2006.01) |
| *H03K 17/0814* | (2006.01) |

(Continued)

(52) U.S. Cl.
CPC ....... *H02M 7/53871* (2013.01); *H02M 1/084* (2013.01); *H02M 1/32* (2013.01); *H02M 3/1588* (2013.01); *H02M 3/335* (2013.01); *H02M 7/538* (2013.01); *H03K 17/0814* (2013.01); *H03K 17/162* (2013.01); *H02M 2001/0009* (2013.01); *H03K 2217/0063* (2013.01)

(58) Field of Classification Search
CPC .... H02M 1/084; H02M 1/32; H02M 7/53871; H02M 7/538; H02M 3/1588; H02M 3/335; H02M 2001/0009; H03K 17/0814
See application file for complete search history.

(56) References Cited

U.S. PATENT DOCUMENTS

| | | | |
|---|---|---|---|
| 8,493,759 B2 | 7/2013 | Viitanen et al. | |
| 2012/0133420 A1* | 5/2012 | Draxelmayr | H02M 3/337 327/430 |

FOREIGN PATENT DOCUMENTS

| | | |
|---|---|---|
| AT | 414187 B | 10/2006 |
| DE | 69913642 T2 | 10/2004 |

(Continued)

*Primary Examiner* — Jue Zhang
(74) *Attorney, Agent, or Firm* — Shumaker, Loop & Kendrick, LLP; James D. Miller

(57) ABSTRACT

A configuration and a method for generating a negative voltage for a high-side switch in an inverter by providing at least one negative bias voltage for an inverter, wherein a simple and safe provision of the negative voltage becomes possible, and the switching costs as well as the costs and expenses for the production of such an inverter are reduced. A secondary winding generating a negative base voltage is arranged on a flyback transformer, wherein a first terminal of the secondary winding is connected to the HV+ potential and a second terminal of the secondary winding is connected via a rectifier diode to the first terminal for outputting the negative base voltage, wherein a bootstrap diode is arranged between the first terminal and a second terminal for outputting a negative base voltage (NEG BIAS A), and wherein a bootstrap capacitor is arranged between the first terminal and the second terminal.

10 Claims, 7 Drawing Sheets

(51) Int. Cl.
  *H02M 3/335* (2006.01)
  *H03K 17/16* (2006.01)
  *H02M 1/00* (2006.01)

(56) References Cited

FOREIGN PATENT DOCUMENTS

| | | |
|---|---|---|
| DE | 202012009919 U1 | 11/2012 |
| JP | S60051458 A | 3/1985 |
| JP | 2008029163 A | 2/2008 |
| JP | 2008125178 A | 5/2008 |
| JP | 5200738 B2 | 6/2013 |

\* cited by examiner

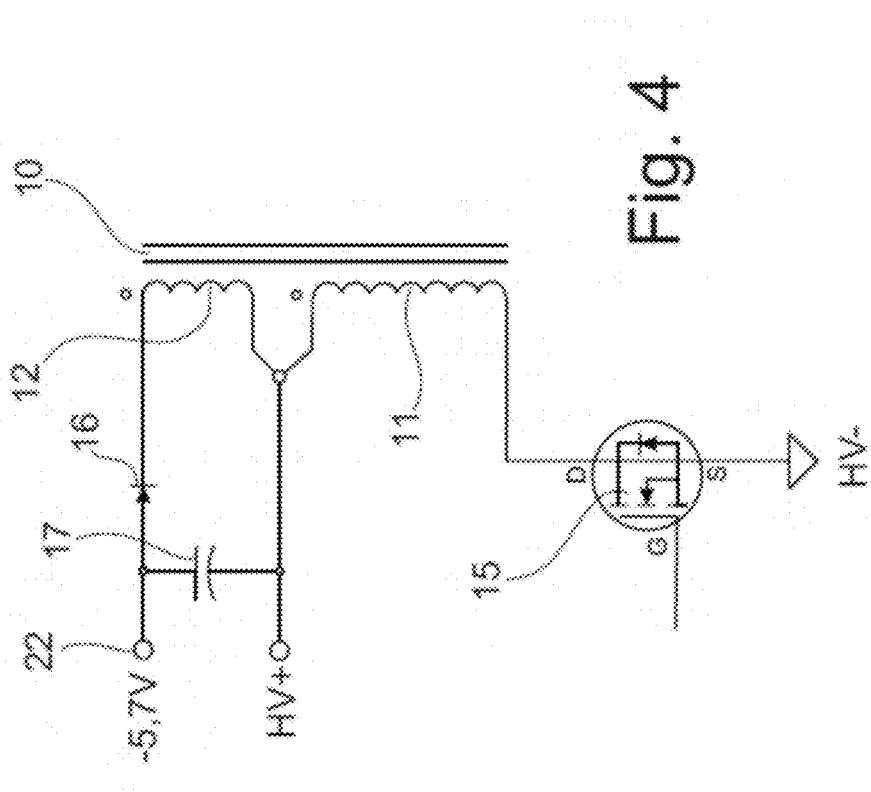

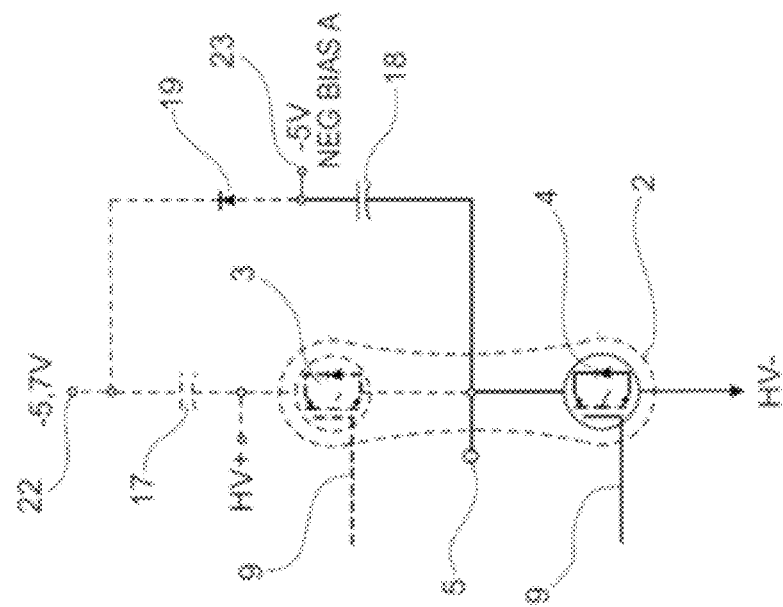
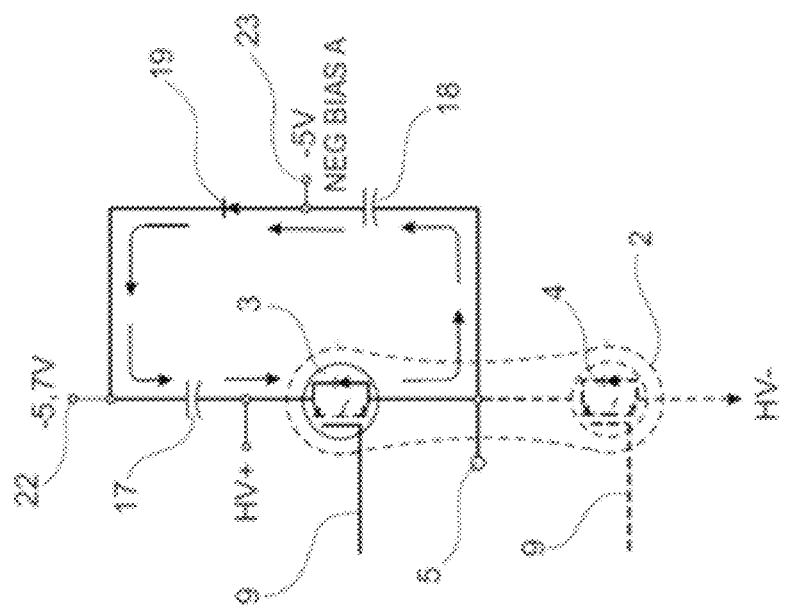

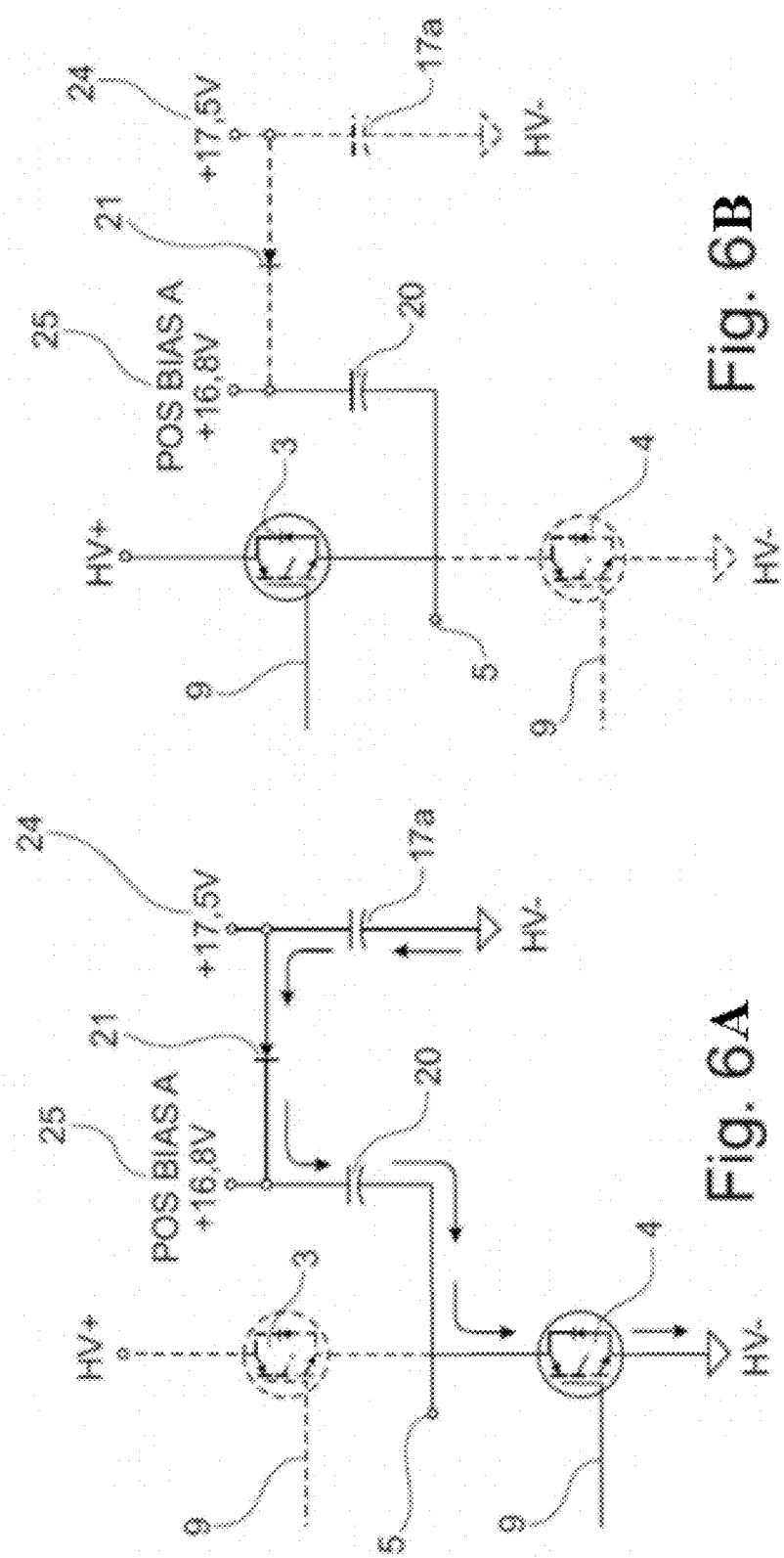

DEVICE AND METHOD FOR GENERATING A NEGATIVE VOLTAGE FOR A HIGH SIDE SWITCH IN AN INVERTER

CROSS REFERENCE TO RELATED PATENT APPLICATION

This patent application claims priority to German Patent Application No. DE 10 2016 123 678.0 filed Dec. 7, 2016, the entire disclosure of which is hereby incorporated herein by reference.

FIELD OF THE INVENTION

The invention relates to a configuration for generating a negative voltage for a high-side switch in an inverter, wherein the configuration comprises a primary winding of a transformer of a flyback converter that is connected to a semiconductor switch, as well as at least one half bridge in which a high-side switch and a low-side switch are serially arranged. The half bridge is arranged between the HV+ and HV− potentials. Between the high-side switch and the low-side switch, a tap is provided for an output phase voltage (Phase A, Phase B, Phase C) of the half bridge. The invention also relates to a method for generating a negative voltage for a high-side switch in an inverter, wherein the negative voltage is applied to a control electrode of a high-side switch for the event that it should be securely locked.

BACKGROUND OF THE INVENTION

Inverters are electric devices which convert or transform direct (DC) voltage into alternating (AC) voltage, that is, a direct current into an alternating current. Inverters should therefore be classified with the group of power converters.

Inverters can be designed for the generation of single-phase or polyphase alternating current also referred to as rotary current, of which the rotation direction follows from the phase shift between the phases. Inverters are typically used when electric consumers, such as, for instance, a motor, requires AC voltage in order to operate, but only a DC voltage power source is available, such as, for instance, a high-voltage vehicle battery, or something similar.

Furthermore, inverters are used when direct current must be fed into an alternating or three-phase current network, in particular in photovoltaic systems that are connected to the power grid for the generation of electricity.

Such inverters are also used for the powering of electric motors with a high-voltage, and therefore with a high, internally stored, intermediate circuit energy, specifically in vehicles with an on-board voltage of more than 60 V. For this voltage range, the motor vehicle industry also uses the term of high-voltage applications (HV applications). Such an application is, for instance, the use of an inverter for an electronically powered refrigerant compressor in a vehicle.

In prior art, inverters are built with a so-called B6 bridge, consisting of six power semiconductors or power switches. In such a B6 bridge, two respective power switches, which are jointly also referred to as a half bridge, are respectively arranged per output phase of the AC output voltage in a cross arm between a DC input voltage line, the tap for the respective output phase being located between the two power semiconductors. Customarily, a first power semiconductor arranged between the tap and the charge and the positive DC input voltage line is referred to as high-side power semiconductor or high-side switch, and the second power semiconductor, arranged between the tap and a negative DC input voltage line or a ground line, is referred to as low-side power semiconductor or low-side switch.

In such a configuration, the power semiconductors, which might, for instance, be a MOSFET, an IGBT, a tyristor, or similar, are controlled by a logic circuit to generate the desired output voltage. Since such logic circuits generally only provide low output voltages in the range of less than 5 V, it is customary to install a driver circuit between the output terminal of the logic circuit and the input terminals of the power semiconductors. This driver circuit provides an output voltage in the range of approximately 15 V, which is applied to the input terminals of the control electrodes of the power semiconductors.

In order to provide power to the driver circuit, which might, for instance, operate for the arranged electronic components at a voltage of 3 V or 5 V, and for providing a voltage of approximately 15 V to the power semiconductors, usually, a separate voltage supply must be provided.

Furthermore, according to prior art, the driver circuits and/or the power semiconductors in the half bridges are protected in high voltage inverters against an undesired parasitic activation by way of special protective measures.

It is therefore advantageous that the driver switch is constructed and operated such that a simultaneous activation of two power semiconductors in one half bridge is ruled out.

A further problem when operating an inverter is that especially in case of high voltage inverters, an undesired activation of the blocked power semiconductor may occur due to the high switch voltages and the steep increase of the switching pulse (dV/dt). The reason for such an undesired activation of the power semiconductor is the parasitic capacities in every real power semiconductor, which are also referred to as Miller capacities. Such a Miller capacity is known from the equivalent circuit diagram of a MOSFET or an IGBT.

As a result of a very fast voltage change in a very short time, a very high value for the dV/dt ratio of the switching voltage between HV+ and HV− is obtained, which might lead to a voltage on the control electrode of a blocked power semiconductor, which, if sufficiently large, may lead to the undesired activation of the power semiconductor.

In order to avoid such critical situations in the half bridge, it is known that the control electrode of the blocked power semiconductors can be switched against the ground potential.

Alternatively, it may be envisaged that the control electrode of the blocked power semiconductors is charged with a negative voltage (bias voltage). In that case, an additional negative bias voltage must be made available for the driver switch. This negative bias voltage may typically have a value of −5 V.

The provision of such a negative bias voltage, for instance for three low-side switches of a three-phase inverter, is possible by means of a single negative voltage of approx. −5 V.

For the high-side switches, on the other hand, of a negative bias voltage for every high-side switch is necessary, since the voltage at the tap is subject to a continuous change of its voltage value. This is also commonly referred to as a floating potential. The provision of such a negative bias voltage is usually accomplished by means of an additional secondary winding on a transformer, which is available anyway. For three negative bias voltages, therefore, three additional secondary windings on the transformer must be provided. Specifically for high-performance inverters that operate in a voltage range of 800 V to approx. 1000 V, appropriate insulation layers must be provided between the individual windings on the transformer core. In addition to the additionally required winding material, this leads to an increase of the construction size and of the weight of the transformer. Moreover, the production cost of such assemblies is higher.

Furthermore, when the transformer is installed on the surface of a circuit board on which the connections of the transformer are soldered to conducting paths on that surface, the forces operating on these conducting paths and on the solder joints increase. This increase of the operating forces is related to the increase in weight. This fact is particularly critical in assemblies that are intended for applications in vehicles, since in vehicles, vibrations occur which lead to an increased load on the soldering joints. This can only be remedied by means of mechanical fixation, for instance by means of adhesion or brackets, involving additional costs and expenses.

SUMMARY OF THE INVENTION

The task of the invention is to indicate a configuration for providing at least one negative bias voltage for an inverter, with which a simple and safe provision of the negative voltage becomes possible, and the switching costs and the costs and expenses for the production of such an inverter are reduced.

The task is solved by an object with the characteristics as shown and described herein The task is also solved by a method with the characteristics as shown and described herein.

The generation of the negative supply voltages for, for instance, three power semiconductors is accomplished by way of two modifications of the assemblies that are present in the inverter anyway, for instance, the refrigerant compressor.

On the one hand, a device is provided that generates and outputs a negative voltage, relative to the HV+ potential.

For example, a flyback converter, which is already present in the inverter for the generation of the driver supply voltages, is enhanced with an additional winding with an output terminal, via which a negative base voltage is provided. This negative base voltage is negative relative to a positive HV input voltage HV+. Alternative designs of the device are possible.

The generated negative base voltage is the basis for the generation of multiple bias voltages for multiple high-side switches arranged in an inverter. By means of these thus-generated bias voltages, the control electrodes of the high-side switches are activated for the event that the high-side switch is meant to block, that is, interrupt, the power current. By applying this negative bias voltage to the control electrodes, an undesired activation of the high-side switch is securely prevented.

On the other hand, for the event that a bootstrap switch is already available, in every half bridge, a further bootstrap switch may be arranged, which taps the negative base voltage and generates a tension with the respective high-side switch. By means of this configuration, a negative voltage in the range of approx. −5 V is available for the control electrode of this respective power semiconductor, independent of the floating potential of each individual high-side switch.

It is advantageous to use MOSFETs, IGBTs or thyristors for the power semiconductors.

It is also envisaged that a positive base voltage be made available, from which subsequently multiple positive bias voltages can be generated for the activation of the control electrodes of the high-side switches. These positive bias voltages are used for an activation status of the high-side switches.

It is further advantageous to combine the generation of the negative and/or positive bias voltages according to the invention with the generation of a negative or positive bias voltage for low-side switches.

DESCRIPTION OF THE DRAWINGS

Further details, characteristics, and advantages of embodiments of the invention follow from the description of embodiments below, in reference to the respective drawings. The following are shown:

FIG. 4 shows an embodiment of a partial circuit according to the invention for the provision of a base voltage used for generating multiple negative bias control voltages at a reduced cost;

FIG. 5A, 5B respectively show a second partial circuit according to the invention in two different operating conditions, by which a negative bias voltage NEG BIAS A is made available;

FIG. 6A, 6B respectively show a circuit configuration for generating a positive bias voltage POS BIAS A is made available in two operating conditions, which are arranged in a three-phase inverter for each half bridge.

DETAILED DESCRIPTION OF AN EMBODIMENT

Figure 1:
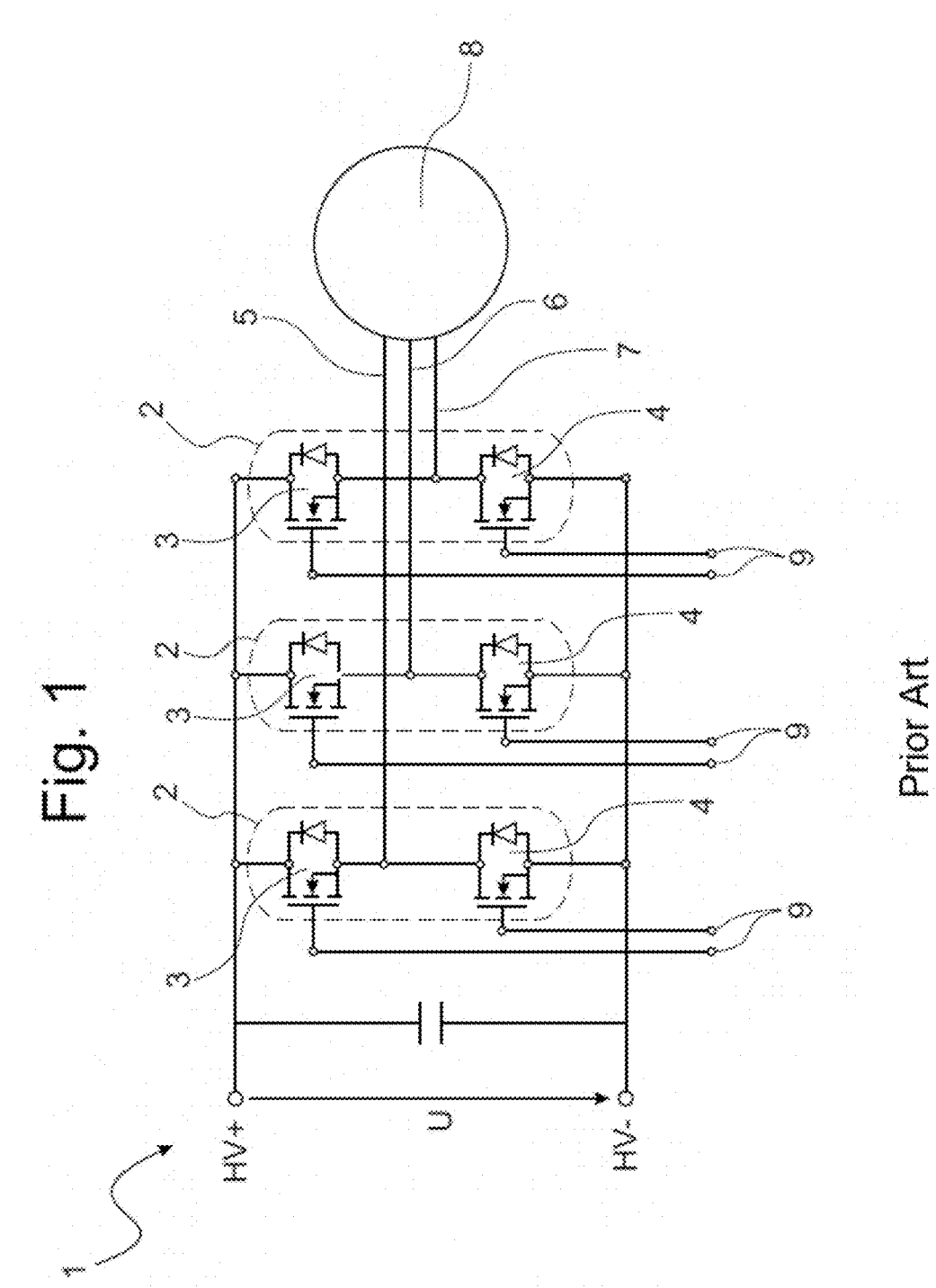
FIG. 1 shows a principal view of an inverter comprising six power semiconductors configured as a B6 bridge from prior art.

FIG. 1 shows an inverter 1, comprising three half bridges 2, each with a high-side switch 3 and a low-side switch 4. The half bridges 2 are arranged between the HV+ and HV− input terminals, via which a direct input voltage is made available to the inverter 1. Between the high-side switch 3 and the low-side switch 4, respective taps are arranged in the half bridges 2, via which the alternating output voltages are made available for Phase A 5, Phase B 6, and Phase C 7. By way of the example of the embodiment according to FIG. 1, a motor operated by a three-phase alternating voltage is arranged by way of a load 8, and connected to the three phases A 5, B 6, and C 7. In one embodiment, this motor may be, for instance, a brushless DC (BLDC) motor. The power semiconductors 3, 4 are activated via their respective control electrodes 9. For these purposes, the control electrodes 9 are connected to a logic circuit, not shown, for activation. Such logic circuits for the activation of multiple power semiconductors, for instance in a B6 bridge, are known from prior art, and are not further described here. Also known from prior art is the configuration of a driver circuit, also not shown in FIG. 1, between the logic circuit and the control electrodes 9.

Figure 2:
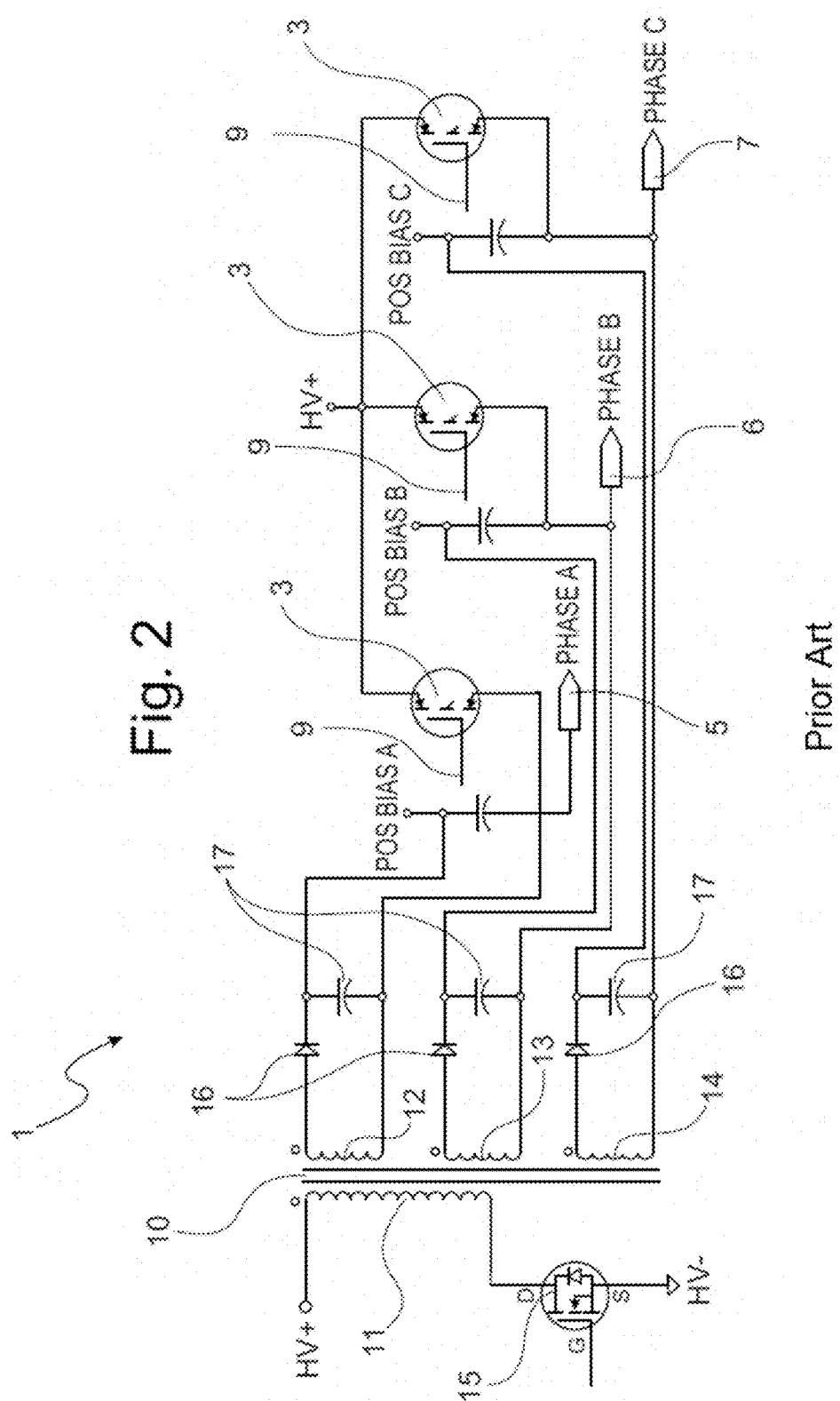
FIG. 2 shows a circuit configuration for the generation of three bias voltages with a positive polarity for three high-side switches of an inverter according to prior art.

FIG. 2 shows a circuit configuration for generating three bias voltages (POS BIAS A, POS BIAS B, POS BIAS C), each with a positive polarity. These bias voltages are known as constant voltages, which are overlaid with an electrical signal, for instance for the activation of power semiconductors 3. In the example shown, the provided bias voltages for the activation of the high-side switches 3 in the half bridges 2 of the inverter 1 are used to activate the power semiconductors 3.

The illustrations in FIG. 1 through 7 only show the elements necessary in order to describe the present invention. Therefore, the low-side switches 4 are not shown in FIG. 2, even though they are present in the half bridges 2 of an inverter 1.

FIG. 2 shows a transformer 10 with a primary winding 11. In order to operate the converter, a conventional semiconductor switch 15 is arranged between one end of the primary winding 11 and a negative HV− potential. This semiconductor switch 15 is controlled via its control electrode (gate) by a control circuit, not shown, of the converter. The transformer 10 comprises three secondary windings 12, 13, 14, of which the first secondary winding 12 is envisaged for the provision of the first bias voltage POS BIAS A, the second secondary winding 13 is envisaged for the provision of the second bias voltage POS BIAS B, and the third secondary winding 14 is envisaged for the provision of the third bias voltage POS BIAS C.

Each of the secondary windings 12, 13, 14 is connected to a conventional rectifier diode 16 and with a conventional charging capacitor 17. A rectification of the AC voltages generated via the secondary windings 12, 13, 14 is performed via the rectifier diode 16. From this pulsating DC voltage, a DC voltage with a low ripple is generated via a charging capacitor 17, with which the POS BIAS A, POS BIAS B, and POS BIAS C are made available, which are then fed to the logic circuit or the driver circuit, neither of which is shown, for the generation of control signals for the control electrodes 9. The high-side switches 3 are connected by their terminals to the HV+ potential on the one hand, and to the respective taps 5, 6, 7, or a terminal for Phase A, Phase B, or Phase C.

By means of the configuration shown in FIG. 2, the three positive bias voltages can be provided for activating the high-side switch 3. Such a bias voltage might, for instance, have a value of +16.8 V. In order to make available this positive supply voltage, which might, for instance, be referenced with respect to an emitter potential of a first power semiconductor 3 for the activation of the gate electrode of the first power semiconductor 3, additional terminals or contacts must be provided for the transformer 10, as well as additional insulation layers between the secondary windings 12, 13, 14.

The generation of a positive supply voltage or bias voltage for the low-side switches 4 or an inverter is possible by means of a further secondary winding for the generation of a joint bias voltage, since all low-side switches 4 are connected to the negative HV− potential on the emitter side, and since this is not a floating potential. This partial circuit is not shown in FIG. 2.

Figure 3:
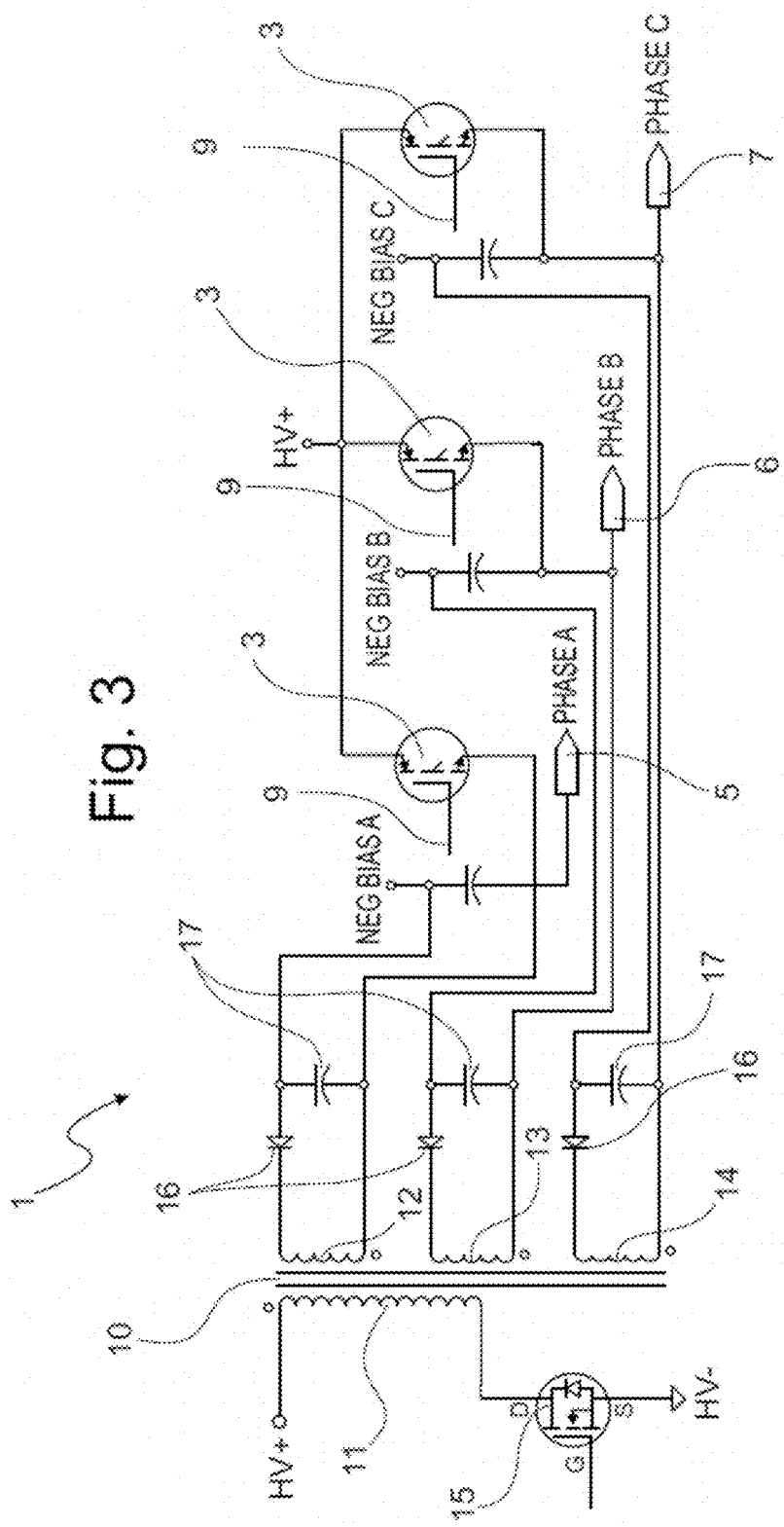
FIG. 3 shows a circuit configuration for the generation of three bias voltages with a negative polarity for three high-side switches of an inverter according to prior art.

FIG. 3 shows a circuit configuration for generating three bias voltages (NEG BIAS A, NEG BIAS B, NEG BIAS C), each with a negative polarity. These bias voltages are also constant voltages, which are overlaid with an electric signal, for instance for the activation of power semiconductors 3. In the example shown, the provided bias voltages for the activation of the high-side switches 3 in the half bridges 2 of the inverter 1 are specifically used for a safe blocking of the power semiconductors 3.

The circuit shown essentially corresponds to the circuit in FIG. 2, so that reference can be made to the explanations relating to FIG. 2, above.

For the generation of the negative bias voltages, two modifications were made to the circuit configuration. First, the winding direction of the secondary windings 12, 13, 14 was changed relative to the arrangement according to FIG. 2, which is identified by the dots next to the secondary windings 12, 13, 14. Second, the polarity of the rectifier diodes 16 was reversed, meaning that the anode terminal and the cathode terminal were switched. This provides three separate and mutually insulated bias voltages for the safe blocking of the high-side switches 3. The disadvantage of this solution is that additional terminals or contacts as well as additional insulation layers between the secondary windings 12, 13, 14 of the flyback transformer 10 must be provided.

FIG. 4 shows an embodiment of a partial circuit for generating multiple negative bias voltages at a reduced cost. The partial circuit shows the provision of a so-called negative base voltage, which represents the basis for the generation of individual negative bias voltages in the half bridges 2. For this purpose, the flyback transformer 10 is provided, which features a single secondary winding 12 in addition to its primary winding 11. The serial arrangement of a semiconductor switch 15 with the primary winding 11, and the arrangement of both of these elements 11, 15 between the HV+ and HV− potentials corresponds to the circuit variant known from prior art.

In order to rectify the AC voltage generated by the secondary windings 12, the rectifier diode 16 is provided, which is polarized such that a negative base voltage is generated, in the present example it is −5.7 V for HV+. In this circuit too, the charging capacitor 17 is provided after the rectifier diode 16 for the smoothing out of the pulsating DC voltage. Accordingly, in this embodiment, the number of required windings and insulation layers required between the windings is reduced, as well as the number of contacts, the volume of the flyback transformer 10, and its cost. In the given example, only one additional insulation layer and one additional contact for the flyback transformer 10 are needed.

A thus provided negative base voltage may have a value of −5.7 V for the HV+ voltage, for example, as shown in FIG. 4.

In the FIGS. 5A, 5B, 6A, 6B, 7A, and 7B, parts of the illustrated partial circuits that are not essentially important to the operating condition described, such as, for instance, a half bridge 2, are indicated by a dashed line.

In FIGS. 5A and 5B, respectively, a second partial circuit of the invention is shown in two different operating conditions. This second partial circuit is required for a voltage bootstrap. FIG. 5A shows the partial circuit in an operating condition in which the high-side switch 3 of the half bridge 2 is activated, and the low-side switch 4 of the same half bridge 2 is blocked.

In this operating condition, the voltage at tap 5 of Phase A is raised via the activated high-side switch 3 to the potential of HV+. Simultaneously, the bootstrap capacitor 18 is charged via the bootstrap diode 19 and the charging capacitor 17 to approx. −5 V via the negative base voltage of −5.7 V for the HV+ potential attached to the charging capacitor 17. The direction of the current via the described components 17, 3, 18, 19 is shown in FIG. 5A by way of multiple arrows.

FIG. 5B shows the partial circuit in an operating condition in which the high-side switch 3 of the half bridge 2 is blocked, while the low-side switch 4 of the same half bridges 2 is activated.

In this operating condition, the voltage at the tap 5 of Phase A falls to the HV− potential. Since the bootstrap diode 19 is now polarized in the blocking direction, the current no longer flows via this diode 19 to the −5.7 V terminal. However, the bootstrap capacitor 18 is still charged at approx. −5 V. This voltage is provided at the terminal marked as −5 V (NEG BIAS A) and used for the activation of the control electrode 9 of the high-side switch 3. The provided voltage of −5 V has a fixed relation with the floating potential at the tap 5 of Phase A, and is supplied to the logic circuit or to the driver circuit, not shown, for the generation of a negative control voltage for the control electrode 9 of the high-side switch 3.

In a subsequent operating cycle of the inverter 1 in which the high-side switch 3 is once again activated and the low-side switch 4 is once again blocked, the bootstrap capacitor 18 is charged again in the manner described above.

Since the configuration described, consisting of a bootstrap capacitor 18 and a bootstrap diode 19, is provided for every half bridge 2, it is possible to provide for every high-side switch 3 of every half bridge 2 a corresponding referenced negative voltage (NEG BIAS A, NEG BIAS B, and NEG BIAS C). This reduces the complexity of the circuit to the provision of three referenced negative voltages in a three-phase inverter 1 to a secondary winding 12, a rectifier diode 16, a charging capacitor 17, a bootstrap diode 19, and a bootstrap capacitor 18, in which the bootstrap diode 19 and the bootstrap capacitor 18 are needed for each half bridge 2.

As is known from prior art and shown in FIG. 2, in order to provide the three positive voltages POS BIAS A, POS BIAS B, and POS BIAS C, a switch with three secondary windings 12, 13, 14 is needed, as well as the additional components 16, 17 previously described with respect to FIG. 2. A further embodiment of the invention also envisages the reduction of the complexity of the circuit for providing multiple positive bias voltages.

For these purposes, it is also provided for the generation of the positive bias voltages POS BIAS A, POS BIAS B, and POS BIAS C that only one secondary winding 12 is arranged on a flyback transformer 10. This secondary winding 12 is connected to its associated rectifier diode 16 and to a charging capacitor 17 in the customary manner, as described above, and thus provides a single positive base voltage, for instance with a value of 17.5 V. Departing from this provided base voltage of 17.5 V, the generation of the required bias voltages is accomplished according to the bootstrap principle again.

FIGS. 6A and 6B respectively show a circuit configuration for the generation of a positive bias voltage POS BIAS A, which must be arranged in a three-phase inverter 1 per half bridge 2. In the second half bridge 2, it generates the POS BIAS B, and in the third half bridge 2 it generates the POS BIAS C. FIGS. 6A and 6B only show an example of the circuit configuration for generating the bias voltage POS BIAS A.

In FIG. 6A, the circuit is shown in an operating condition in which the high-side switch 3 of the half bridges 2 is blocked, and the low-side switch 4 of the same half bridges 2 is activated.

In this operating condition, the voltage at tap 5 of Phase A is reduced by the opened low-side switch 4 to the HV− potential. This leads to a flow in the direction marked by arrows via the second bootstrap diode 21 that is polarized in the flow direction, the second bootstrap capacitor 20 being charged. Between the second bootstrap capacitor 20 and the second bootstrap diode 21, the voltage tap for the positive bias voltage POS BIAS A is arranged, to which in the example of the embodiment shown in FIG. 6A, a voltage of +16.8 V is provided.

This voltage is available to the logic circuit and/or to the driver circuit, not shown, for generating a control signal for activating the high-side switch 3, and which is applied to the control electrode 9 of the high-side switch 3. The positive base voltage for the circuit shown, which was generated via a secondary winding 12 and at least one rectifier diode and a charging capacitor 17a, is applied to the terminal marked +17.5 V. The secondary winding 12 as well as the rectifier diode 16 are not shown in FIG. 6A. The charging capacitor 17a is arranged between the +17.5 V terminal and the HV− potential.

FIG. 6B shows the circuit in an operating condition in which the high-side switch 3 of the half bridge 2 is activated, and the low-side switch 4 of the same half bridge 2 is blocked.

In this case, the tap 5 of Phase A is extended via the opened high-side switch 3 to the HV+ potential. Since this HV+ potential is higher than the provided base voltage of 17.5 V, the second bootstrap diode 21 is blocked. Via the still charged second bootstrap capacitor 20, the voltage of +16.8 V for the logic circuit and/or the driver circuit is made available to the POS BIAS A terminal. This bias voltage of 16.8 V is made available at the terminal of Phase A, and therefore, for instance, to the emitter terminal of the high-side switch 3, with a relatively relation to the floating potential.

In a subsequent operating cycle of the inverter 1, in which the high-side switch 3 is once again blocked and the low-side switch 4 is once again activated, the second bootstrap capacitor 20 is charged again in the manner described above.

Figure 7B:
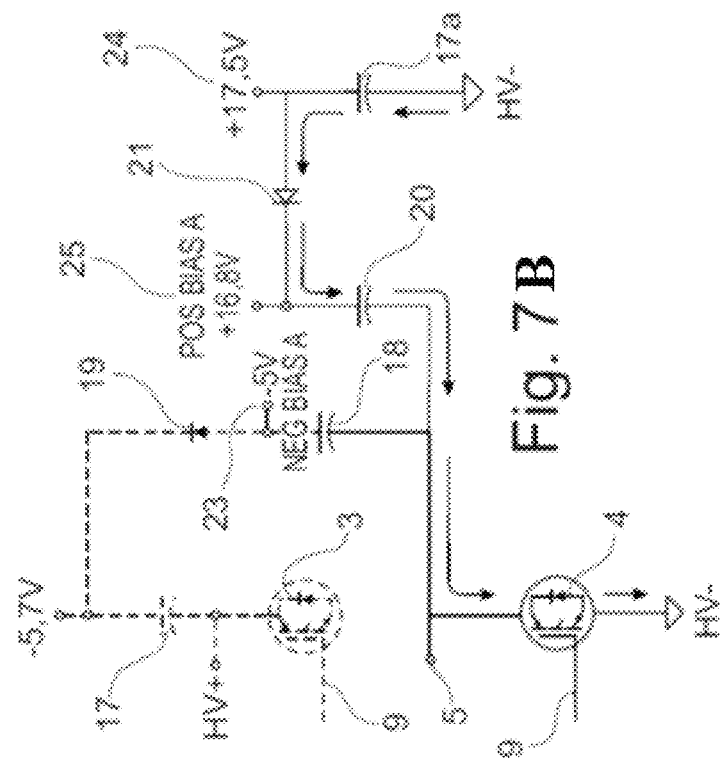
FIG. 7A, 7B respectively show a further variant of the circuit according to the invention for generating a positive bias voltage POS BIAS A and a negative bias voltage NEG BIAS A in a half bridge.
Figure 7A:
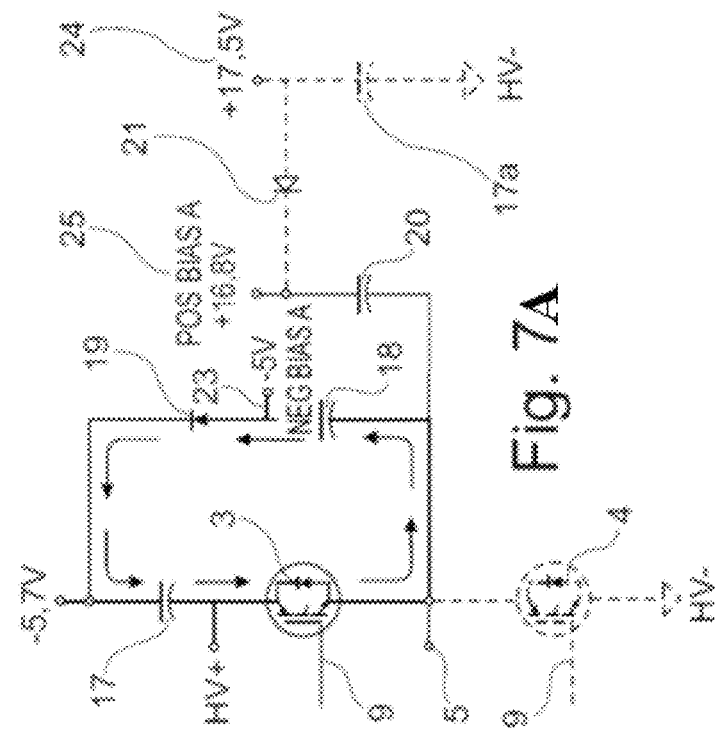

FIGS. 7A and 7B respectively show a further variant of the circuit for generating a positive bias voltage POS BIAS A and a negative bias voltage NEG BIAS A in a half bridge 2.

FIGS. 7A and 7B show the advantageous combination of the circuit for generating the negative bias voltage NEG BIAS A previously described with respect to FIGS. 5A and 5B with the circuit for generating the positive bias voltage NEG BIAS A, previously described with respect to FIGS. 6A and 6B, in a half bridge 2 of an inverter 1. This combination of circuits is provided for each half bridge 2 of the inverter 1.

Thus, departing from a positive base voltage and a negative base voltage, the provision to every half bridge 2 of a positive bias voltage POS BIAS A from 16.8 V, for instance, and respectively, of a negative bias voltage NEG BIAS A from −5 V, for instance, may be accomplished at a lower cost.

FIG. 7A shows the circuit in an operating condition in which the high-side switch 3 of the half bridge 2 is activated, and the low-side switch 4 of the same half bridge 2 is blocked.

Since the potential at tap 5 of Phase A is extended to almost HV+ via the high-side switch 3, the charging process of the bootstrap capacitor 18 takes place in the manner previously described with respect to FIGS. 5A and 5B. Simultaneously, the bias voltage POS BIAS A of +16.8 V is made available by the charged second bootstrap capacitor 20.

FIG. 7B shows the circuit in an operating condition in which the high-side switch 3 of the half bridge 2 is blocked, and the low-side switch 4 of the same half bridge 2 is activated.

In this operating condition, the potential at tap 5 of Phase A is extended to almost HV− via the low-side switch 4. Therefore, the charging process of the second bootstrap capacitor 20 takes place in the manner previously described with respect to FIGS. 6A and 6B, while the charged bootstrap capacitor 18 provides the negative bias voltage NEG BIAS A of −5 V.

These processes of activating and blocking the power semiconductors 3, 4 of the half bridge 2 continuously repeat themselves, as the bootstrap capacitors 18, 20 are repeatedly charged. This accomplishes a continuous provision of the positive and/or the negative bias voltage in the half bridges.

One field of application of the invention is the use of the inverter 1 according to the invention in an electric refrigerant compressor of a vehicle.

Benefits that can be obtained due to the invention are in the simple accomplishment of the generation of multiple negative bias voltages for multiple high-side switches 3 of an inverter 1, in which Miller clamping, which is customary for a safe operation of the inverter 1 can be advantageously realized. It is known that with Miller clamping, the control electrode of a power semiconductor can be connected to the ground potential, or that it can be activated with a negative voltage, in order to prevent an undesired activation of the power semiconductor. The causes of such an undesired activation are the parasitic capacities (Miller capacities) existing in a real component, on the one hand, and in a high value of the dV/dt ratio of the switching voltage between HV+ and HV−, on the other hand.

Furthermore, the invention accomplishes a reduction of the complexity of the inverter 1 (flyback converter) and of its assembly space on a circuit board, since a smaller flyback transformer 10 can be used.

The size reduction of the flyback transformer 10 also leads to a more robust design, in particular in case of vibrations occurring in vehicles, as well as to a reduction of the production costs by obviating the need of secondary windings, insulation layers, and terminals in and on the flyback transformer 10.

REFERENCE LIST 1 inverter
2 half bridge
3 first power semiconductor (high-side switch)
4 second power semiconductor (low-side switch)
5 tap Phase A
6 tap Phase B
7 tap Phase C
8 load/motor
9 control electrodes
10 flyback transformer
11 primary winding
12 first secondary winding
13 second secondary winding
14 third secondary winding
15 semiconductor switch
16 rectifier diode
17, 17a charging capacitor
18 bootstrap capacitor
19 bootstrap diode
20 second bootstrap capacitor
21 second bootstrap diode
22 first terminal (negative base voltage)
23 second terminal (NEG BIAS A)
24 third terminal (positive base voltage)
25 fourth terminal (POS BIAS A)

What is claimed is:

1. A configuration for generating a negative voltage for a high-side switch in an inverter, wherein the configuration comprises:

a primary winding of a transformer of a flyback converter connected to a semiconductor switch and at least one half bridge in which a high-side switch and a low-side switch are serially arranged, the half bridge arranged between HV+ and HV− potentials, and in which between the high-side switch and the low-side switch, a tap is provided for an output phase voltage of the half bridge; and a device for generating a negative voltage in relation to the HV+ potential for outputting the generated voltage with a first terminal, wherein a first bootstrap diode is arranged between the first terminal and a second terminal for outputting a negative bias voltage (NEG BIAS A), wherein a first bootstrap capacitor is arranged between the second terminal and the tap, wherein a secondary winding generating a negative base voltage is arranged on the flyback converter, wherein a first terminal of the secondary winding is connected to the HV+ potential, and wherein a second terminal of the secondary winding is connected via a rectifier diode to the first terminal of the device for generating the negative voltage in relation to the HV+ potential for outputting the negative base voltage.

2. The configuration according to claim 1, wherein a charging capacitor is arranged between the first terminal of the device for generating the negative voltage in relation to the HV+ potential and the HV+ potential.

3. The configuration according to claim 1, wherein multiple half bridges are arranged parallel to each other in the inverter, with a bootstrap diode and a bootstrap capacitor arranged in each of the half bridges.

4. The configuration according to claim 3, wherein IGBTs, MOSFETs, or thyristors are used in the half bridges by way of high-side switches and/or low-side switches.

5. A configuration for generating a negative voltage for a high-side switch in an inverter, wherein the configuration comprises:

a primary winding of a transformer of a flyback converter connected to a semiconductor switch and at least one half bridge in which a high-side switch and a low-side switch are serially arranged, the half bridge arranged between HV+ and HV− potentials, and in which between the high-side switch and the low-side switch, a tap is provided for an output phase voltage of the half bridge; and a device for generating a negative voltage in relation to the HV+ potential for outputting the generated voltage with a first terminal, wherein a first bootstrap diode is arranged between the first terminal and a second terminal for outputting a negative bias voltage (NEG BIAS A), wherein a first bootstrap capacitor is arranged between the second terminal and the tap, wherein a secondary winding generating a positive base voltage is arranged on the flyback converter wherein a first terminal of the secondary winding is connected to the HV− potential, wherein a second terminal of the secondary winding is connected via a rectifier diode to a third terminal for outputting the positive base voltage, wherein a second bootstrap diode is arranged between the third terminal and a fourth terminal for outputting a positive bias voltage (POS BIAS A), and wherein a second bootstrap capacitor is arranged between the fourth terminal and the tap.

6. The configuration according to claim 5, wherein a charging capacitor is arranged between the third terminal and the HV− potential.

7. A method for generating a negative voltage for a high-side switch in an inverter, wherein the negative voltage is applied to a control electrode of the high-side switch when it should be safely blocked, the method comprising steps of:
providing a primary winding of a transformer of a flyback converter connected to a semiconductor switch;
providing a device for generating the negative voltage in relation to an HV+ potential for outputting the generated voltage with a first terminal;
providing a negative base voltage for use in multiple half bridges which is negative with respect to the HV+ potential; and
generating a negative bias voltage for the high-side switch of the corresponding half bridge by a bootstrap process based on the provided negative base voltage for each of the half bridges, the generated negative bias voltage generated in a fixed relation to a phase voltage of a corresponding one of the half bridges, wherein a secondary winding generating the negative base voltage is arranged on the flyback converter, wherein a first terminal of the secondary winding is connected to the HV+ potential, and wherein a second terminal of the secondary winding is connected via a rectifier diode to the first terminal of the device for generating the negative voltage in relation to the HV+ potential for outputting the negative base voltage.

8. The method according to claim 7, wherein the generation of a negative bias voltage is performed in parallel on the half bridges.

9. The method according to claim 7, wherein the negative base voltage is generated in a voltage range between −3 V and −9 V.

10. The method according to claim 7, wherein a positive base voltage is generated in a voltage range between +10 V and +20 V in addition to and simultaneously with the negative base voltage.

* * * * *